(12) United States Patent
Saha et al.

(10) Patent No.: US 9,703,613 B2
(45) Date of Patent: Jul. 11, 2017

(54) MULTI-CORE DYNAMIC WORKLOAD MANAGEMENT USING NATIVE AND DYNAMIC PARAMETERS

(71) Applicant: QUALCOMM Incorporated, San Diego, CA (US)

(72) Inventors: Juhi Saha, San Diego, CA (US); Hee Jun Park, San Diego, CA (US); Alex Kuang-Hsuan Tu, San Diego, CA (US); Thomas Andrew Morison, San Diego, CA (US); Tao Xue, San Diego, CA (US); Ronald Frank Alton, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 716 days.

(21) Appl. No.: 14/137,914

(22) Filed: Dec. 20, 2013

(65) Prior Publication Data
US 2015/0178138 A1  Jun. 25, 2015

(51) Int. Cl.
| | | |
|---|---|---|
| *G06F 9/46* | (2006.01) | |
| *G06F 9/50* | (2006.01) | |
| *G06F 17/50* | (2006.01) | |
| *G06F 1/32* | (2006.01) | |

(52) U.S. Cl.
CPC .......... *G06F 9/5094* (2013.01); *G06F 1/3203* (2013.01); *G06F 1/329* (2013.01); *G06F 1/3293* (2013.01); *G06F 17/5009* (2013.01); *Y02B 60/121* (2013.01); *Y02B 60/142* (2013.01); *Y02B 60/144* (2013.01)

(58) Field of Classification Search
None
See application file for complete search history.

(56) References Cited

U.S. PATENT DOCUMENTS

| | | | |
|---|---|---|---|
| 7,886,172 B2 | 2/2011 | Bose et al. | |
| 8,055,822 B2 | 11/2011 | Bernstein et al. | |
| 8,566,836 B2 | 10/2013 | Ramaraju et al. | |
| 2009/0254901 A1* | 10/2009 | King | G06F 1/3203 718/1 |
| 2010/0153954 A1* | 6/2010 | Morrow | G06F 1/329 718/102 |
| 2011/0265092 A1* | 10/2011 | Ohtani | G06F 9/5094 718/104 |

(Continued)

FOREIGN PATENT DOCUMENTS

WO    WO-2007077516 A1    7/2007

OTHER PUBLICATIONS

Cui J., et al., "A Fast High-Level Event-Driven Thermal Estimator for Dynamic Thermal Aware Scheduling", IEEE Transactions on Computer Aided Design of Integrated Circuits and Systems, IEEE Service Center, Piscataway, NJ, US, vol. 31, No. 6, Jun. 1, 2012 (Jun. 1, 2012), pp. 904-917, XP011444381, ISSN: 0278-0070, DOI: 10.1109/TCAD.2012.2183371.

(Continued)

*Primary Examiner* — Tammy Lee
(74) *Attorney, Agent, or Firm* — Haynes and Boone, LLP

(57) ABSTRACT

A dynamic scheduler is provided that schedules tasks for a plurality of cores based upon current operating characteristics for the cores. The current operating characteristics include a predicted leakage current for each core based upon an analytical model.

13 Claims, 6 Drawing Sheets

(56) References Cited

U.S. PATENT DOCUMENTS

| | | | |
|---|---|---|---|
| 2012/0159496 A1 | 6/2012 | Dighe et al. | |
| 2012/0191857 A1 | 7/2012 | Doorhy et al. | |
| 2012/0192200 A1* | 7/2012 | Rao | G06F 9/4893 718/105 |
| 2013/0047166 A1* | 2/2013 | Penzes | H03K 3/0315 718/105 |
| 2014/0344827 A1* | 11/2014 | Mavila | G06F 9/4893 718/104 |
| 2015/0094995 A1* | 4/2015 | Allen-Ware | G06F 11/3006 703/2 |

OTHER PUBLICATIONS

Donald J., et al., "Techniques for multicore thermal management: Classification and new exploration." ACM SIGARCH Computer Architecture News 34.2, 2006: pp. 78-88.

International Search Report and Written Opinion—PCT/US2014/070279—ISA/EPO—Apr. 9, 2015.

Jejurikar R., et al., "Leakage aware dynamic voltage scaling for real-time embedded systems", Design Automation Conference, 2004. Proceedings. 41st San Diego, CA, USA Jun. 7-11, 2004, Piscataway, NJ, USA,IEEE, Jun. 7, 2004 (Jun. 7, 2004), pp. 275-280, XP010715660, ISBN: 978-1-5118-3828-3, p. 275,left-hand column-right-hand column, Line 13 Section 2. "Power Model"; p. 276.

Zhou X., et al., "Thermal Management for 3D Processors via Task Scheduling", Parallel Processing, 2008, ICPP '08, 37th International Conference On, IEEE, Piscataway, NJ, USA, Sep. 9, 2008 (Sep. 9, 2008), pp. 115-122, XP031321541, ISBN: 978-0-7695-3374-2 abstract; figures 1, 2, 5 p. 118, col. 2, line 40-p. 120, col. 1, line 17.

\* cited by examiner

MULTI-CORE DYNAMIC WORKLOAD MANAGEMENT USING NATIVE AND DYNAMIC PARAMETERS

TECHNICAL FIELD

This application relates to the dynamic scheduling of tasks for a multi-core processor.

BACKGROUND

As circuit density has increased, all or most components of a computer system or other electronic system may be integrated into a single chip to form a system-on-a chip (SOC). The advances in circuit density enable an SOC to include multiple instantiations of a circuit module or hardware module. For example, an SOC for a smart phone may include a quad core central processing unit (CPU), a digital sensing processor (DSP) with four hardware threads, a graphic processing unit (GPU) including four algorithm logic units (ALUs), a plurality of wireless local area network (WLAN) interfaces, a modem having three vector processing engines (VPEs), and multiple L2 cache on-chip memories. As used herein, the terms "core" or "module" are used interchangeably with regard to such multiple instantiations of the same circuit structure.

An SOC will typically be configured with an operating system or some other type of host software application that will select a particular core from a group of the same cores for a particular task. To enable such a selection, each core from a group of identical or substantially identical cores will typically be associated with a serial number or character that serves as identification (ID) or an address of the hardware module. The address may be based upon the geographical location of a hardware core on a die or its manufacturing order (or other parameters). Using the address, the operating system selects a particular hardware module from a group of such hardware modules for a particular task. Ideally, identical hardware modules should exhibit identical characteristics and performance. But with the advances in circuit density, it is common for identical modules such as CPU cores to show considerable variation in their performance and properties. For example, even if cores are directly adjacent to one another on the die, the die itself has semiconductor process variations that cause identical circuits to behave differently. Moreover, the die may have temperature or voltage variations at the different locations for the hardware modules that will also affect their performance. However, present hardware core selection schemes do not account for these individual characteristics.

There is thus a need in the art for a processor architecture that intelligently selects hardware cores to increases performance and lower power consumption.

SUMMARY

A dynamic scheduler is provided that schedules tasks for a plurality of cores. The dynamic scheduler core power and thermal model configured to analytically model a leakage current power for each core based upon the cores' native leakage currents and current temperatures and also configured to model a dynamic power for each core based upon a current voltage and clock frequency for each core. The dynamic scheduler implements a scheduling algorithm that uses operating parameters for the cores such as the leakage current powers and the dynamic powers to schedule the tasks.

The scheduling algorithm implemented by the dynamic scheduler may also use a wide variety of other operating parameters such as the thermal gradient for each core (or equivalently, its thermal conductivity). Other operating parameters include the core's location on the die, the maximum clocking frequency for each core, and an associated voltage regulator efficiency for each core. The advantageous use of these and other operating parameters for the core with regard to a dynamic scheduling of tasks for the cores will be discussed further below.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

A multi-processor system is provided that includes a dynamic scheduler for scheduling tasks for a plurality of hardware cores. Unlike prior art schedulers, the disclosed dynamic scheduler implements a scheduling algorithm that accounts for current operating parameters for the hardware cores in addition to their native operating parameters. As used herein, "native" operating parameters refer to performance parameters characterized upon manufacture. These parameters are static—in other words, they do not rely upon current operating parameters for the hardware cores. For example, such native parameters include the leakage current as a function of temperature and the maximum operating frequency (Fmax). It is known to use the native parameters. For example, if the native leakage current is determined for each hardware core, a conventional scheduler could simply assign a low power task to a core with the lowest native leakage current. But scheduling based only upon native operating parameters is not optimal. For example, suppose a core with the lowest native leakage has a low power task is assigned to it accordingly by a conventional scheduler. If, however, that core had just been active such that its temperature is elevated (or it is in the vicinity on the die of a circuit module such as a camera or graphics processor that is or has just been active and thus heated the core via heat diffusion), then the leakage current for such a relatively hot core could actually be higher than the leakage for the remaining cores—even though these cores had ostensibly higher native leakage currents. The scheduling algorithm for the dynamic scheduler disclosed herein accounts for the current operating conditions as well as the native operating parameters to thus advantageously increase operating performance and reduce power consumption.

Figure 1:
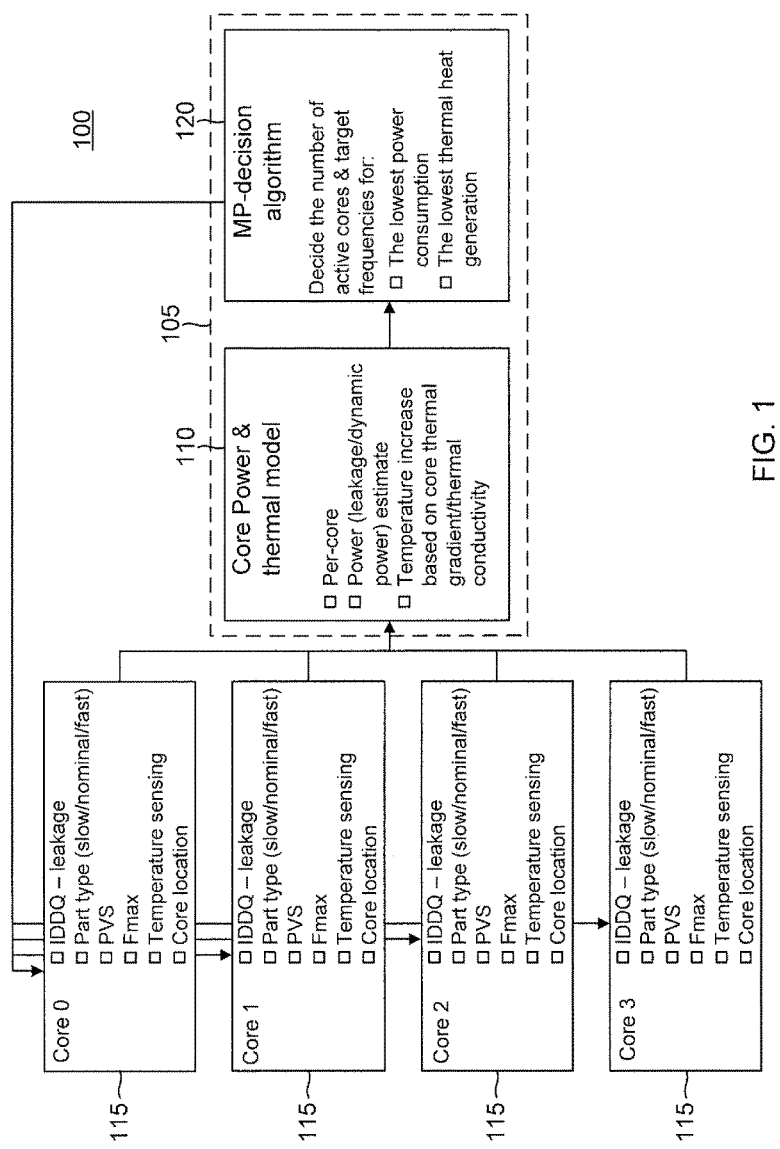
FIG. 1 is a block diagram of an example multi-core processor system with a dynamic workload scheduler in accordance with an embodiment of the disclosure.

An example multi-processor system 100 is shown in FIG. 1. System 100 may comprise a system-on-a-chip (SoC) or may comprise multiple dies. A dynamic scheduler 105 schedules tasks for a plurality of CPU cores 115, including a core 0, a core 1, a core 2, and a core 3. It will be appreciated, however, that other types and quantities of hardware cores may be scheduled in this fashion. The following discussion will assume that dynamic scheduler 105 is implemented in software although it will be appreciated that dynamic scheduler 105 could also be implemented in a dedicated state machine or other suitable hardware. In a software-based embodiment, one of the cores 115 may be configured to implement dynamic scheduler 105. Alternatively, dynamic scheduler 105 may be distributed across the cores 115 such that whatever core (or cores) that is currently active would implement dynamic scheduler 105.

Dynamic scheduler 105 includes an analytic power and thermal modeler 110 for each core 115 that enables dynamic scheduler 105 to calculate current power consumption and leakage currents for each core based upon the core's native and current operating parameters. For example, each core 115 is associated with a temperature sensor (not illustrated) configured to transmit the core's temperature to dynamic scheduler 105. Modeler 110 can then map the core's native leakage current as a function of the current temperature into the core's present leakage current ($I_{leakage}$) using an analytical model. In that regard, the native leakage current is measured at a reference temperature. The analytical model predicts the current or expected leakage current based, in part, upon the change between the current temperature and the reference temperature. Using the modeled present leakage currents, modeler 110 may use the current operating voltage V for each core to determine a leakage current power ($P_{leakage}$) for each core. In addition, dynamic scheduler 105 may determine the per-core dynamic power consumption ($P_{dynamic}$) so that a total power consumption ($P_{total}$) may be calcluated, which equals a sum of the present leakage current ($P_{leakage}$) as well as the dynamic power ($P_{dynamic}$). The dynamic power $P_{dynamic}$ equals $f*C*V^2$ where f is the core's current operating frequency or clocking rate, C is the core's dynamic capacitance, and V is the core's current operating voltage. Thus, the total power consumption ($P_{total}$) for a core equals the sum of $P_{leakage}$ and $P_{dynamic}$. In one embodiment, dynamic scheduler 105 may be deemed to comprise means for scheduling tasks for the cores based upon an analytical model of the leakage current predicted for the cores The native leakage current (IDDQ) used by analytic core power and modeler 110 may be determined with regard to a reference operating voltage $V_{ref}$ and a reference temperature $T_{ref}$. In other words, a native leakage current IDDQ is measured (or estimated) upon manufacture for each core at the reference operating voltage $V_{ref}$ and the reference temperature $T_{ref}$. A variety of analytical models may be used in analytic core power & thermal modeler 110. For example, one example analytic model uses the following equation to calculate the current leakage current $I_{leakage}$:

$$I_{leakage}=IDDQ*\exp(m*(V-V_{ref})+n*(T-T_{ref}))$$

where n and m are operating parameters and exp is the exponential function. The modeled leakage current $I_{leakage}$ is thus the predicted leakage current based upon the current operating parameters of the corresponding core 115. In other words, $I_{leakage}$ for a given core 115 is the leakage current that modeler 110 predicts that that core 115 will experience if it is chose for a current task.

Dynamic scheduler 105 implements a multi-processor (MP) task-assignment or scheduling algorithm 120 that may use the modeled leakage and dynamic powers for the cores 115 from modeler 110 to select a core 115 that provides the lowest power consumption for a given task. But power consumption is not the only factor with regard to an MP scheduling decision. Another factor is a thermal limit for cores 115 that is reached when a demanding or high-power task is being executed. In that regard, it is known to implement core-hopping and other scheduling techniques to accommodate core thermal limit issues. But MP scheduling algorithm 120 may use the thermal gradient for each core 115 to more intelligently select a core 115 with regard to avoiding thermal limits. Like the native leakage current IDDQ, the thermal gradient for each core 115 may be determined upon manufacture. The thermal gradient is the temperature change as a function of time that each core 115 will experience as it operates on a given task. For example, the thermal gradients for each core 115 may be characterized when the processors are operated at their maximum clocking frequency (fmax). An equivalent parameter to the thermal gradient is the thermal conductivity for each core 115, which refers to the ability for a given core 115 to shed heat as it operates. One can appreciate that the thermal gradients and the thermal conductivities for the various cores 115 are inversely related to each other. In other words, a core 115 that has a relatively high thermal gradient has a relatively low thermal conductivity. Conversely, a core 115 that has a relatively low thermal gradient would have a relatively high thermal conductivity. Based upon the thermal gradient (or thermal conductivity), modeler 110 may predict the temperature increase that a given core 115 will experience should it be assigned the current task. MP scheduling algorithm 110 thus may select for the core 115 that will have the lowest temperature increase for a given task.

Dynamic scheduler 105 may use a wide variety of operating parameters from cores 115 in addition to their native leakage IDDQ and current temperature. For example, dynamic scheduler 105 may rely on the process corner for the cores (whether they correspond to a slow/nominal/or fast process). In that regard, dynamic scheduler 105 may select one core 115 or a plurality of cores 115 for a given task depending upon the various operating parameters including the process corner. For example, the processor voltage scaling (PVS) may be different for each core 115. For example, at a given clock frequency, one core 115 may require a higher supply voltage as compared to another core 115 operating at the same clock rate. Dynamic scheduler 105 may thus select the core 115 that can operate at the lower voltage so as to reduce the total power consumption. The clock frequency may also be scaled as known in dynamic clock and voltage scaling (DCVS) implementations. In that regard, the maximum operating frequency or clocking rate (Fmax) may be different for the various cores 115. At a given operating voltage, one core 115 may thus be able to achieve a higher Fmax. Dynamic scheduler 105 could thus select for such a core 115 for demanding or high-power tasks to achieve the fastest performance at the lowest power consumption. It will be appreciated, however, that the PVS/DCVS may not be independent for cores 115. In such embodiments, all cores 115 would have the same set of voltage and clock rates that may be selected from. There could be no distinction between cores 115 with regard to their Fmax and operating voltages in such a uniform DCVS embodiment.

Another operating parameter that dynamic scheduler 105 may rely upon for cores 115 is their location on the die (or dies) and the relationship of that location to other heat sources. For example, a core 115 may have a location that is most remote from another core 115 that has just been pushed to its thermal limit. The scheduling of a high-power task such as video processing to such a remote core 115 is thus advantageous. Alternatively, a core 115 may be located relatively close on the die to another active circuit such as a modem processor or a video processor. Such a core 115 would not be a good choice for a high-power task as it will more rapidly reach its thermal limit in that it must also accommodate the heat from this nearby active circuit. The selection of a core 115 that is more remote from this active circuit is thus advantageous.

Figure 2:
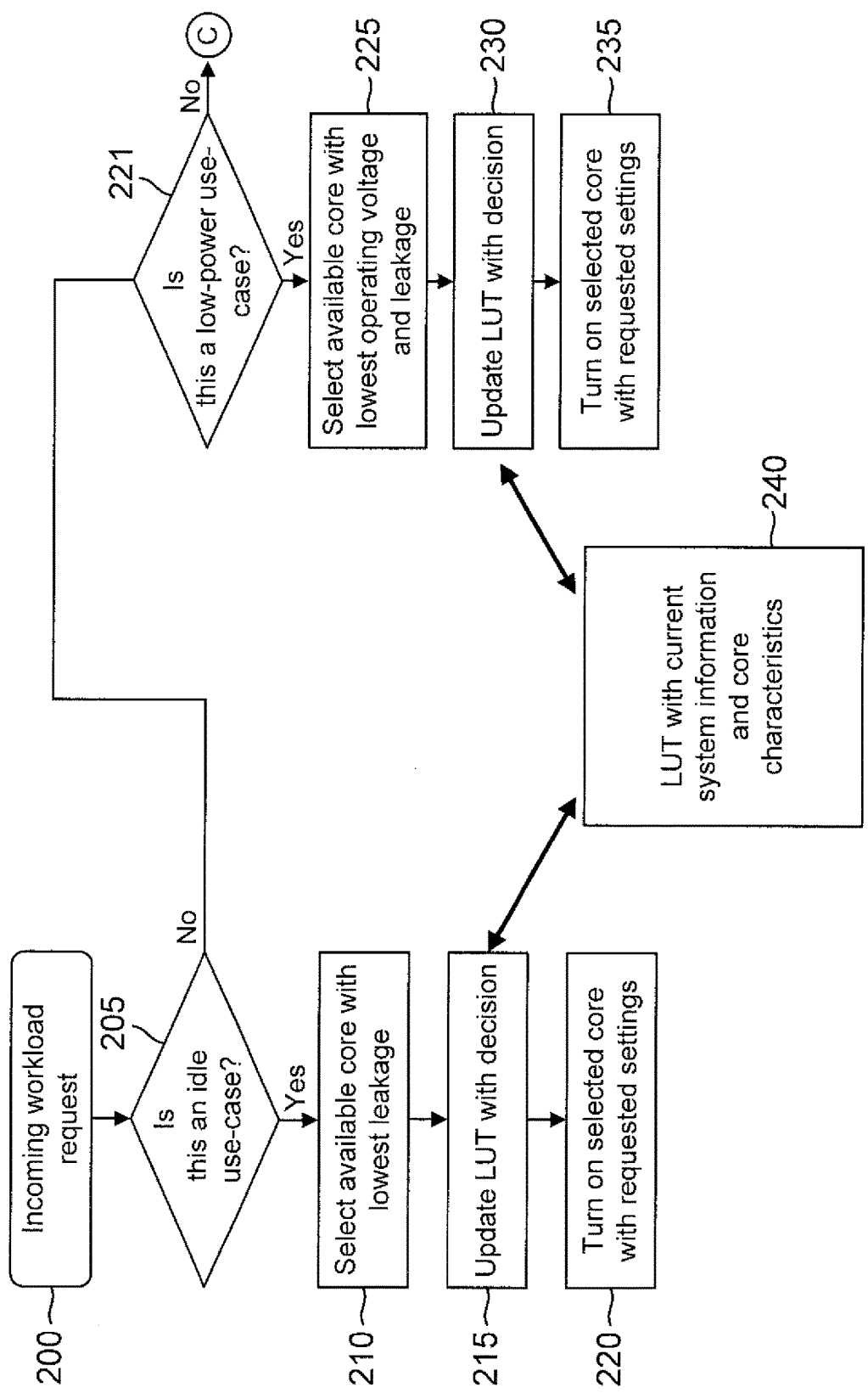
FIG. 2 is a flowchart for a dynamic scheduling of a workload request for an idle use-case as well as a low-power use-case.

Some example use cases will now be discussed to better illustrate the advantageous features of dynamic scheduler 105. For example, if system 100 is idle, dynamic scheduler 105 may minimize power consumption by scheduling the idle task to the core with the lowest leakage. The resulting scheduling process is shown in FIG. 2, in which an incoming workload request 200 is tested to determine if it is an idle use-case in a step 205. For example, in a cellular phone application, there are often periods in which the user is not interacting with the phone nor is it receiving any calls or texts. Cores 115 are thus largely idle during such an idle-use case. Upon determination that the task request corresponds to an idle-use case, a memory such as a look-up table (LUT) 240 may store the current system information for cores 115 and their operating parameters and characteristics. For example, LUT 240 may store the identity of the core 115 with the lowest leakage current as determined by modeler 110. Should the determination in step 205 be positive, dynamic scheduler 105 then selects for an available core 115 with the lowest leakage current in a step 210 as identified by LUT 240. Dynamic scheduler 105 may then update LUT 240 with the scheduling decision in a step 215. Finally, dynamic scheduler 105 turns on the selected core 115 with the requested settings in a step 220.

Should the determination in step 205 be negative, the incoming workload request 200 may comprise a low-power use-case as determined in a step 221. Examples of low-power use-cases include tasks such as video playback or web-browsing. If the determination in step 221 is positive, dynamic scheduler 105 may then minimize total power consumption by scheduling the core (or cores) in a step 225 with the lowest total power consumption characteristics as identified in LUT 240 as determined by modeler 110. In a subsequent step 230, dynamic scheduler 105 may update LUT 240 with the scheduling decision. Finally, dynamic scheduler 105 turns on the selected core 115 with the requested settings in a step 235.

Figure 3:
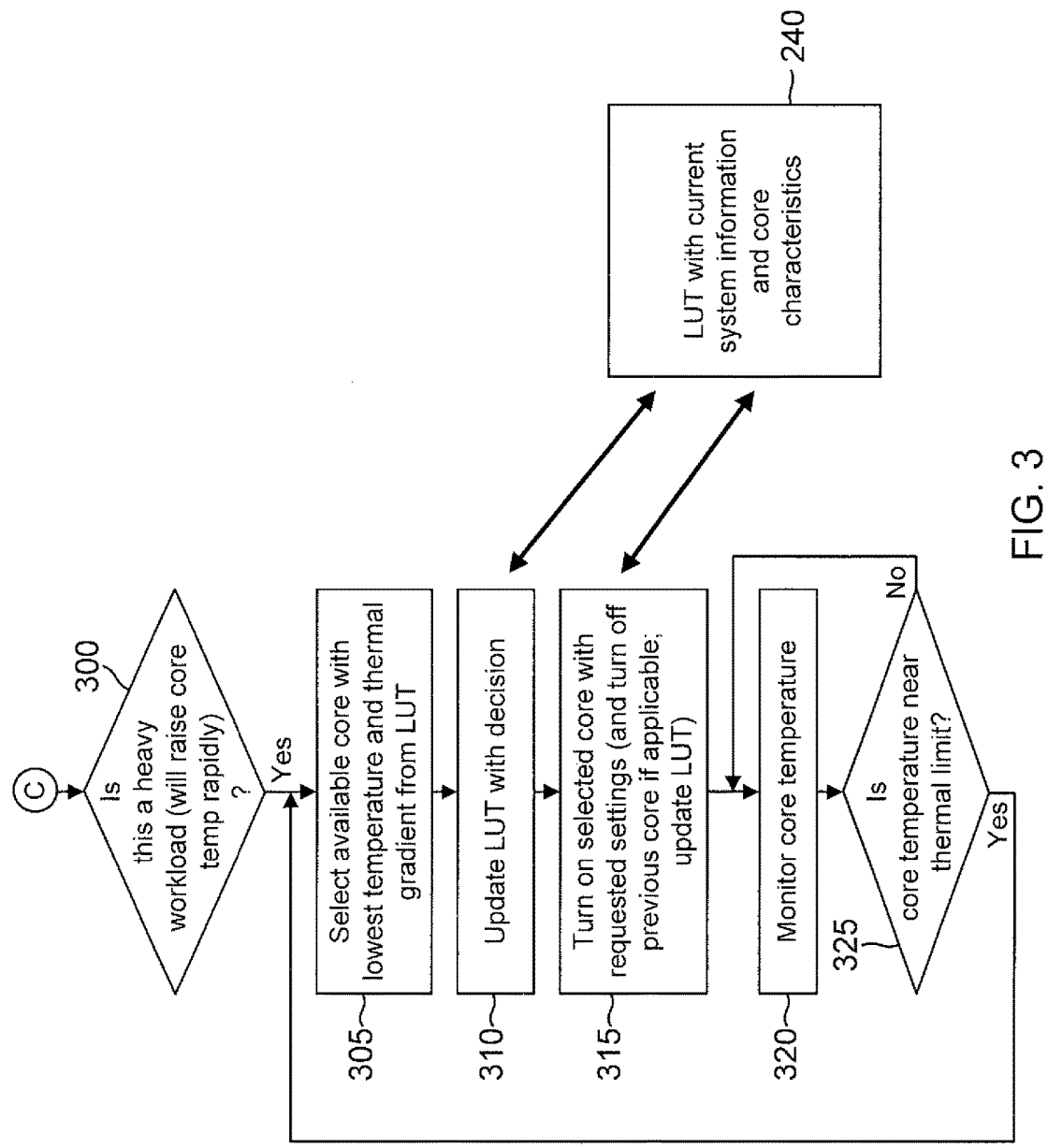
FIG. 3 is a flowchart for a dynamic scheduling of a workload request for a high-power use-case.

If the determination in step 221 is negative, incoming workload request 200 may comprise a heavy (high performance) workload use-case such as intensive graphics processing for a video game (or a similar high-power mode) as determined in a step 300 in FIG. 3. Dynamic scheduler 105 may then select the core 115 (or cores) that can provide the desired performance without exceeding their thermal limits in a step 305. For example, step 305 may select for the available core 115 that has the lowest temperature and a favorable thermal gradient as identified in LUT 240. A subsequent step 310 updates LUT 240 with the scheduling decision. In a step 315, dynamic scheduler 105 turns on the selected core 115 with the requested settings. Note that the selected core 115 may eventually become too hot such that it is in danger of exceeding its thermal limit. Thus, dynamic scheduler 105 may monitor the selected core temperature in a step 320 to determine if the selected core 115 is near its thermal limit in a step 325. If the determination in step 325 is negative, the monitoring may continue in step 320. But if the selected core 115 is reaching its thermal limit, dynamic scheduler 105 renews its scheduling selection in step 305. Steps 310, 315, 320, and 325 may then be repeated with regard to the newly-selected core 115. Step 315 may thus also comprise turning off a previously-selected core 115 and updating LUT 240 with the new selection.

Figure 4:
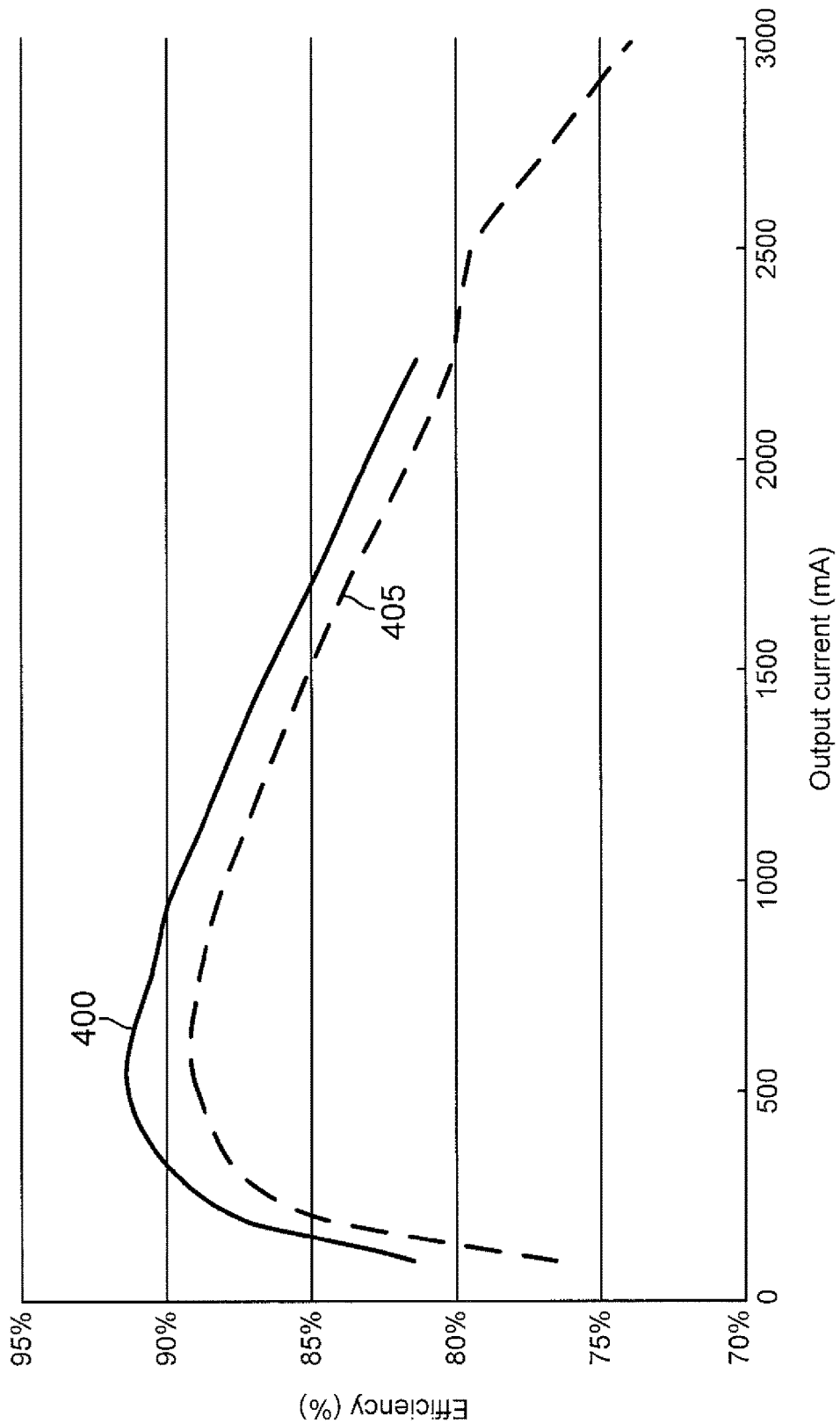
FIG. 4 is a graph of voltage regulator efficiencies as a function of their output current.
Figure 5A:
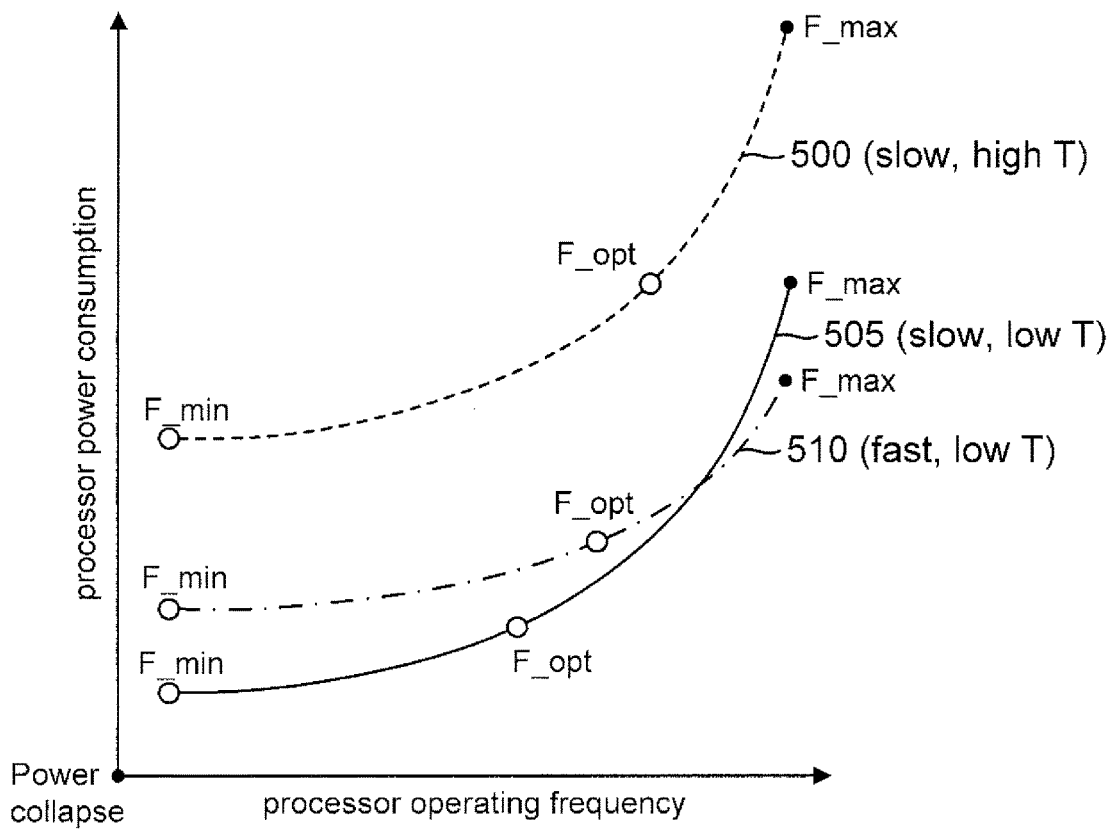
FIG. 5A is a graph of the processor power consumption as a function of the processor clocking frequency for a plurality of cores.

The minimization of total power consumption by dynamic scheduler 105 may also take into consideration the power regulator efficiency for each core. In that regard, each core 115 in multi-processor system 100 is powered by a corresponding power regulator (not illustrated). There would thus be a core 0 power regulator, a core 1 power regulator, and so on. Alternatively, a power regulator may be shared by a subset of the cores in system 100. In one embodiment, modeler 110 also models each power regulator's efficiency based upon the current total power consumption $P_{total}$ for the corresponding core (or cores). For example, modeler 110 may map the total power consumption for a core 115 into the current drawn by the core 115 from its power regulator. Modeler 110 may also include a model of each power regulator's efficiency as a function of current it supplies, its operating voltage, it clocking frequency, and other functional parameters. Such regulator efficiency models typically exhibit a roughly bell-shaped efficiency curve that peaks at some optimal current value and then drops down as the current is either reduced or increased from this optimal value. For example, FIG. 4 illustrates the efficiency as a function of output current for a voltage regulator 400 and 405. The efficiency for both voltage regulator 400 and 405 peaks between 500 and 1000 milli-amps of output current. Dynamic scheduler 105 can thus uses this information to avoid scheduling a core 115 for tasks in which its voltage regulator efficiency may be too low. For example, FIG. 5A illustrates the processor power consumption for a slow process corner core 500 at a relatively high temperature, a slow process corner core 505 at a relatively low temperature, and a fast process corner core 510 at a relatively low temperature. All the power consumptions shown in FIG. 5A monotonically increase as the operating frequency (processor clock rate) is increased. Thus, one might expect that the best efficiencies would be produced by operating these cores at frequencies as low as possible given that the cores will consume the least amount of power at such frequencies. But such an assumption ignores the sharply reduced power efficiency for the associated power regulators since each power regulator would then be supplying less than its optimal amount of current to its associated core.

Figure 5B:
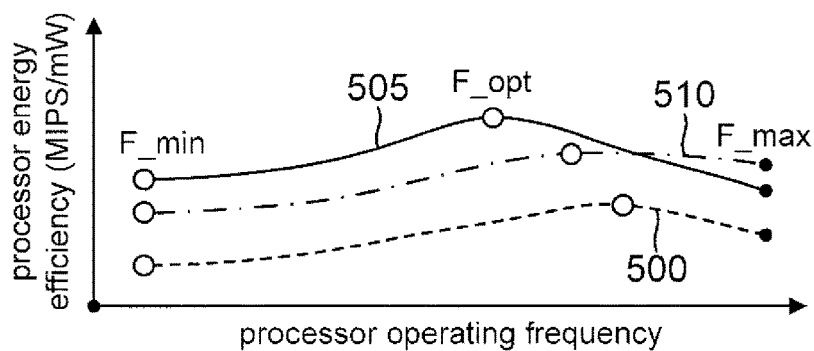
FIG. 5B is a graph of the processor efficiency as a function of processor operating frequency.

In one embodiment, modeler 110 thus models the power consumption ($P_{regulator}$) from each power regulator as a function of its efficiency based upon the core clocking frequency. Dynamic scheduler 105 may thus schedule tasks to cores 115 so that a system-level power consumption ($P_{system}$) is minimized, where $P_{system}$ equals $P_{total}$ for each core plus the associated $P_{regulator}$ for each core (or group of cores if they share a corresponding power regulator). FIG. 5B illustrates the processor energy efficiency as a function of operating frequency for cores 500, 505, and 515, where the energy efficiency is calculated using the system-level power consumption $P_{system}$. Each core's energy efficiency has a peak efficiency at an operating frequency (F_opt) that is less than Fmax. Dynamic scheduler 105 may thus disable operating frequencies in a level 515 that is below F_opt for the cores.

Referring again to FIG. 3, dynamic scheduler 105 may be configured to weight the selection of a core 115 in step 305 with the resulting energy efficiency. For example, if a high-power task is expected to be relatively short such that there is little danger of reaching a thermal limit, the core selection may instead be governed by maximizing energy efficiency. As the task time is increased, step 305 may weight the thermal factors (the core with the lowest temperature and thermal gradient) more heavily as compared to the energy efficiencies.

Figure 6:
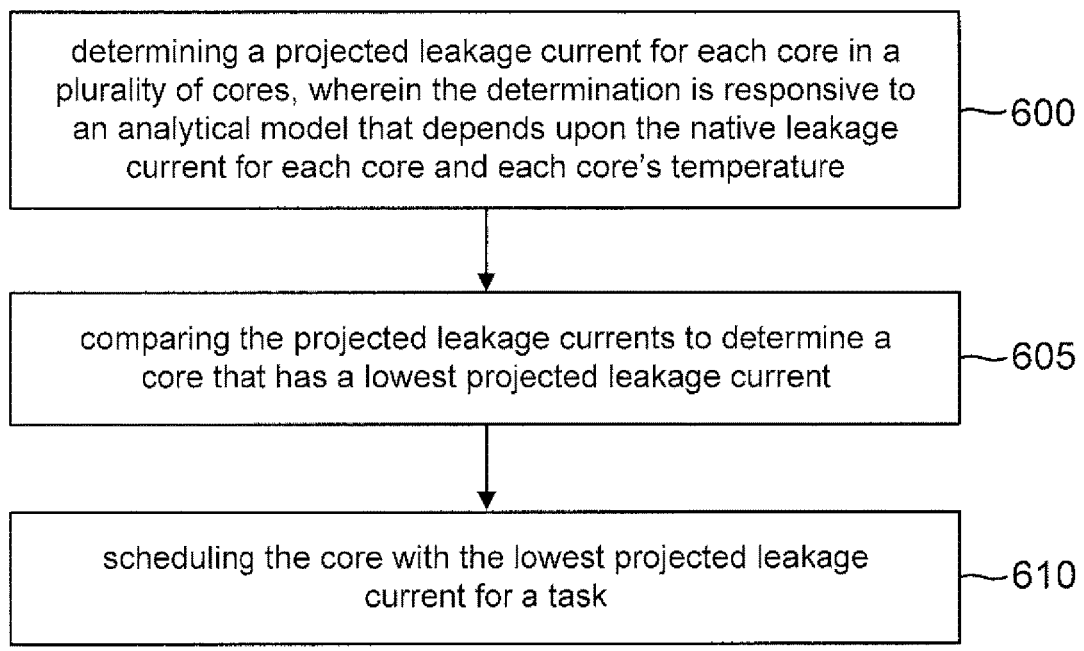
FIG. 6 is a flowchart for an example dynamic scheduling algorithm in accordance with an embodiment of the disclosure.

An example method of operation for dynamic scheduler 105 will now be addressed with reference to FIG. 6. A step 600 comprises determining a projected leakage current for each core in a plurality of cores, wherein the determination is responsive to an analytical model that depends upon the native leakage current for each core and each core's temperature. A step 605 comprises comparing the projected leakage currents to determine a core that has a lowest projected leakage current. Finally, a step 610 comprises scheduling the core with the lowest projected leakage current for a task.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A system comprising:
    a plurality of cores, each core having an individual temperature gradient and an individual thermal conductivity;
    an analytic core power and thermal modeler configured to analytically model a leakage power for each core based upon the cores' native leakage currents and current temperatures and to model a dynamic power for each core based upon a current voltage and clock frequency for each core and to determine a total power consumption for each core based upon a sum of the core's leakage power and the core's dynamic power, and
    a dynamic scheduler further configured to schedule tasks for the cores based upon whether each task is an idle-use case or a low-power use case, wherein the system comprises a cellular telephone, and wherein a user is not interacting with the cellular telephone during the idle-use cases, and wherein the cellular telephone is not receiving a call or text during the idle-use cases, and wherein the dynamic scheduler is configured to select for a core having a lowest leakage power for the idle-use case and to select for a core having a lowest total power consumption for the low-power use case.

2. The system of claim 1, wherein the dynamic scheduler is further configured to schedule the tasks based upon a thermal parameter for each core selected from the core's individual temperature gradient and the core's individual thermal conductivity.

3. The system of claim 2, wherein the thermal parameter for each core is the core's individual thermal conductivity.

4. The system of claim 2, wherein the dynamic scheduler is further configured to schedule the tasks based upon a location for each core on a die.

5. The system of claim 4, wherein the dynamic scheduler is further configured to schedule the tasks based upon a proximity of the core locations to other heat sources on the die.

6. The system of claim 4, wherein the dynamic scheduler is further configured to schedule the tasks based upon a proximity of the core locations with respect to recently-scheduled core locations.

7. The system of claim 2, wherein the dynamic scheduler is further configured to schedule the tasks for the cores based upon an efficiency for each core's power regulator.

8. The system of claim 7, wherein the dynamic scheduler is further configured to schedule the tasks based upon an expected task time duration for each task.

9. The system of claim 7, wherein the dynamic scheduler is further configured to determine a system power consumption that depends upon the total power consumption for each core and an efficiency for each core's power regulator, and wherein the dynamic scheduler is further configured to schedule the tasks to minimize the system power consumption.

10. A method for a cellular telephone including a multi-core processor having a plurality of cores, comprising:
    determining a projected leakage power for each core in the plurality of cores, wherein the determination is responsive to an analytical model that depends upon a native leakage current for each core, a temperature of each core, and an operating voltage for each core, and wherein each core has an individual temperature gradient and an individual thermal conductivity;
    determining a dynamic power consumption for each core based upon an operating voltage for each core;
    determining a total power consumption for each core based upon a sum of the core's projected leakage power and the core's dynamic power consumption;
    scheduling one of the cores for an idle-use-case task based upon which core has a lowest projected leakage power, wherein a user is not interacting with the cellular telephone during the idle-use-case task and wherein the cellular telephone is not receiving calls or texts during the idle-use-case task;
    scheduling at least one of the cores for a low-power use-case task based upon which core has a lowest total power consumption and
    scheduling at least one of the cores for a high-performance use-case task based upon a thermal parameter for each core selected from the core's individual temperature gradient and the core's individual thermal conductivity and based upon which core has the lowest temperature.

11. The method of claim 10, wherein the thermal parameter for each core is the core's individual thermal gradient, the method further comprising determining which core has the lowest individual thermal gradient, wherein the scheduling of the at least one of the cores for the high-performance use-case task is further based upon which core has the lowest individual thermal gradient.

12. The method of claim 10, wherein the thermal parameter for each core is the core's individual thermal conductivity, the method further comprising determining which core has the highest individual thermal conductivity, wherein the scheduling of the at least one of the cores for the high-performance use-case task is further based upon which core has the highest individual thermal conductivity.

13. The method of claim 10, further comprising:
  determining a power regulator efficiency for each core, and
  selecting a core for a second task based upon a system-level efficiency that depends upon the power regulator efficiency for each core.

* * * * *